United States Patent [19]

Hoffman et al.

[11] Patent Number: 5,291,124

[45] Date of Patent: Mar. 1, 1994

[54] TESTER FOR HIGH VOLTAGE MEASURING APPARATUS

[75] Inventors: Mark R. Hoffman, Lake Forest, Ill.; Niels C. Pedersen, Jr., Hillsboro, Wis.

[73] Assignee: HD Electric Company, Deerfield, Ill.

[21] Appl. No.: 906,694

[22] Filed: Jun. 30, 1992

[51] Int. Cl.⁵ .................. G01R 31/02; G01R 1/04
[52] U.S. Cl. .................... 324/72.5; 361/235; 324/156
[58] Field of Search .............. 324/72.5, 156, 149, 324/133; 340/660; 361/235; 363/61

[56] References Cited

U.S. PATENT DOCUMENTS

| | | | |
|---|---|---|---|
| 3,287,642 | 11/1966 | Simkins | 324/149 |
| 3,402,351 | 9/1968 | Kradel | |
| 3,567,996 | 3/1971 | Gordon | 361/235 |
| 3,731,145 | 5/1973 | Senay | 361/235 |
| 3,840,808 | 10/1974 | Liebermann | 324/149 |
| 4,120,016 | 10/1978 | Hendricks | 361/235 |
| 4,184,112 | 1/1980 | Cox | 324/127 |
| 4,196,465 | 4/1980 | Buschor | 361/235 |
| 4,298,837 | 11/1981 | Koslar | 324/72.5 |
| 4,527,118 | 7/1985 | Koslar | 324/133 |
| 4,696,189 | 9/1987 | Hochrenther | 324/149 |
| 4,859,932 | 8/1989 | Whitley | 324/72.5 |
| 5,136,234 | 8/1992 | Shaw | 324/72.5 |

*Primary Examiner*—Kenneth A. Wieder
*Assistant Examiner*—Maura K. Regan
*Attorney, Agent, or Firm*—Emrich & Dithmar

[57] ABSTRACT

A tester applies a high-voltage test signal across the probes of a high-voltage measuring apparatus, wherein at least one of the probes is mounted at a probe end of an elongated insulated pole. The tester includes a battery-powered generator for generating the test signal which is applied across two contact terminals, respectively adapted for connection to the probes. One of the contact terminals is disposed at the bottom of an elongated tubular socket which receives the probe end of the pole, the contact terminal including two conductive members spring-biased apart until the pole is inserted in the socket. The generator is energized through a switch which may be mounted on the generator housing. In one embodiment the other contact terminal is an alligator clip and in a second embodiment the other contact terminal is disposed in a second socket.

19 Claims, 2 Drawing Sheets

TESTER FOR HIGH VOLTAGE MEASURING APPARATUS

BACKGROUND OF THE INVENTION

1. Field of the Invention

The invention relates to voltage measuring apparatus for use with high-voltage circuits, such as high-voltage electric power transmissions systems and, in particular, to the testing of such measuring apparatus.

2. Description of the Prior Art

In high-voltage electrical systems, such as electrical transmission lines and equipment, it is frequently necessary to determine if selected lines or wires are energized and/or to measure the voltage between two points in the system, such as the voltage between two transmission lines or wires or the voltage between a single wire and ground. Because of the high voltage involved, it is essential that test personnel be able to safely connect the test equipment to the high voltage lines. For this purpose, elongated, insulated sticks or poles are used to permit personnel to contact electrically energized circuits.

One common type of test equipment is a voltmeter which includes two probes adapted to be electrically coupled to the two points in the high-voltage circuit between which electric potential is to be measured, and a meter connected between the two probes. In one form of this type of voltmeter, both of the probes are mounted at the ends of elongated insulated sticks or poles, and in another form one of the probes is on an insulated pole and the other probe may be at the end of a ground cable.

It is desirable to be able to test the operation of such voltmeters to determine electrical continuity within the voltmeter, to check the operability and calibration of the meter and to determine proper connection between the probes. Indeed, certain government regulations now require high voltage testing of such voltmeters before and after each use. Heretofore, this has been a significant inconvenience since high-voltage sources are not readily available. Accordingly, a crew typically has to be dispatched to a remote location where a known voltage source is available in order to confirm proper operation of the voltmeter.

SUMMARY OF THE INVENTION

It is a general object of the invention to provide a tester for a high-voltage measuring apparatus which avoids the disadvantages of prior test devices while affording additional structural and operating advantages.

An important feature of the invention is the provision of a portable tester which generates a high-voltage test signal.

In connection with the foregoing feature, another feature of the invention is the provision of a tester of the type set forth which is battery-powered.

Another feature of the invention is the provision of a tester of the type set forth which protects a user against accidental exposure to the high-voltage test signal generated by the tester.

Yet another feature of the invention is the provision of a tester of the type set forth which is adapted for use with voltmeters having pole-mounted probes.

In connection with the foregoing feature of the invention, another feature is the provision of a tester of the type set forth, wherein either or both of the voltmeter probes are pole-mounted.

These and other features of the invention are attained by providing a portable tester for a high-voltage measuring apparatus which includes two electrically conductive probes adapted for electrical coupling respectively to points in a high-voltage circuit between which the potential is to be measured, with at least one of the probes being disposed at a probe end of an elongated electrically insulating pole, and a voltmeter connected across the probes, the tester comprising: housing means including an elongated tubular socket formed of electrically insulating material and having an open outer end and a closed inner end and dimensioned to receive the probe end of the pole, generating means disposed in the housing means and having a pair of output terminals and generating a high-voltage test signal across the output terminals, and two contact terminals respectively connected to the output terminals and respectively adapted to be electrically connected to the probes, one of the contact terminals being disposed at the inner end of the tubular socket for electrical contact with the probe end of the pole when it is inserted in the socket.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there are illustrated in the accompanying drawings preferred embodiments thereof, from an inspection of which, when considered in connection with the following description, the invention, its construction and operation, and many of its advantages should be readily understood and appreciated.

DESCRIPTION OF THE PREFERRED EMBODIMENTS

Figure 1:
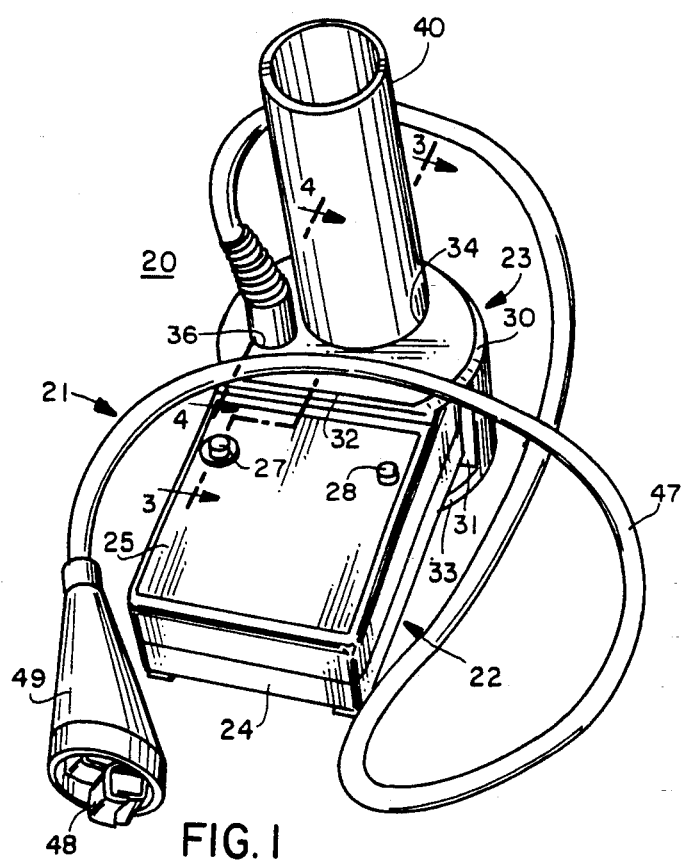
FIG. 1 is a perspective view of a tester constructed in accordance with and embodying the features of a first embodiment of the present invention.
Figure 2:
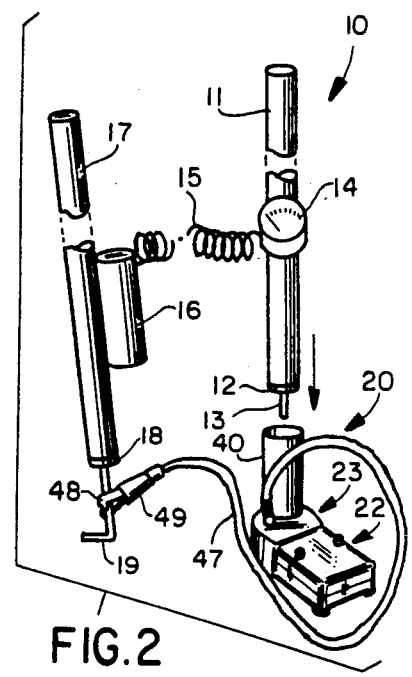
FIG. 2 is a reduced perspective view of the tester of FIG. 1, illustrated in use for testing an associated voltmeter which is shown with portions broken away.
Figure 7:
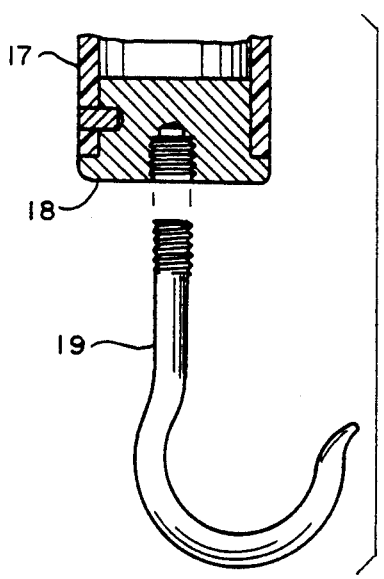
FIG. 7 is an enlarged, fragmentary view of the probe end of one of the voltmeter poles of FIG. 2, illustrating disengagement of the probe therefrom.

Referring to FIG. 2, the present invention is designed for use in testing a high-voltage voltmeter 10 which includes an elongated, electrically insulating stick or pole 11, which may be tubular in configuration and is provided at one end with an electrically conducting probe mount 12 which carries an electrically conducting probe 13. Mounted on the pole 11 is a voltmeter 14 which is preferably connected by a suitable conductor (not shown) extending through the pole 11 to the probe 13. The meter 14 is connected by a cord 15 to a junction box 16 carried by another elongated electrically insulating stick or pole 17, which may be substantially identical to the pole The pole 17 carries at one end thereof an electrically conductive probe mount 18 which, in turn, carries a conductive probe 19 which may be generally hook shaped. Preferably, the probes 13 and 19 are removably mounted on probe mounts 12 and 18, respectively. Thus, each of the probes 13 and 19 may be provided with an externally threaded end which is threadedly engaged in a complementary opening in the associated probe mount 12 or 18 (see FIG. 7). The voltmeter 10 may be of a type which is sold by HD Electric Company under the trade designation "Mark I Voltmeter Phaser".

While the voltmeter 10 is illustrated as having the probes 13 and 19 respectively mounted at the ends of elongated insulating sticks or poles 11 and 17, it will be appreciated that one of the probes could simply be provided at the end of a ground cable extending from the meter 14, also in a known manner. The voltmeter 10 is designed for measuring very high voltages in the kilovolt range, such as are present in electric power distribution systems.

Figure 3:
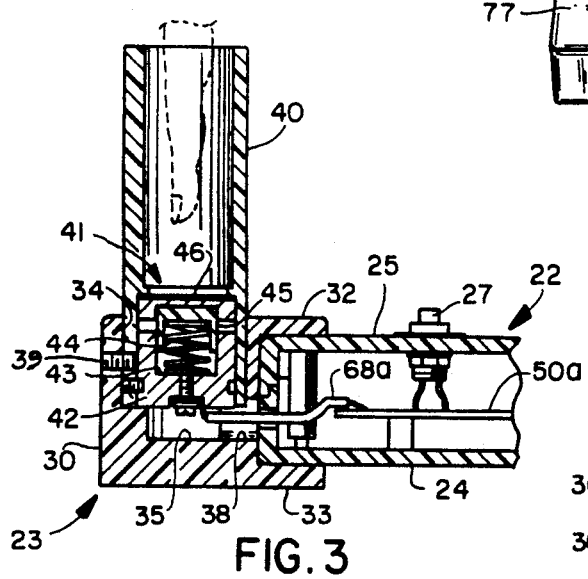
FIG. 3 is a fragmentary view in vertical section taken along the line 3—3 in FIG. 1.
Figure 4:
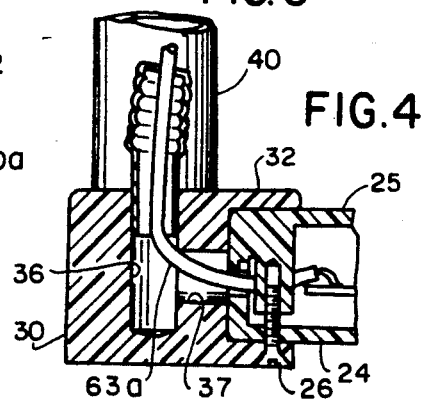
FIG. 4 is a fragmentary view in vertical section taken along the line 4—4 in FIG. 1.

Referring now also to FIGS. 3 and 4, there is disclosed a tester, generally designated by the numeral 20, for testing the voltmeter 10. The tester 20 has a housing assembly 21 which includes a circuit housing 22 and a terminal housing 23. The circuit housing 22 is generally in the shape of a rectangular box and includes an electrically insulating base 24 and cover 25 interconnected by a plurality of suitable screws 26 (one shown in FIG. 4) which preferably extend upwardly through the base 24 and into the cover 25, in a known manner. The cover 25 carries a pushbutton switch actuator 27 and a lens 28 for a light-emitting diode (LED), as will be explained in greater detail below.

The terminal housing 23 has an electrically insulating part-cylindrical base 30 which is truncated along a chord of the cylinder, the side wall of the cylinder having a recess 3 formed therein at the chord to define upper and lower flanges 32 and 33. The recess 31 is dimensioned to receive therein one end of the circuit housing 22, which may be fixed to the base 30 by passing two of the circuit housing assembly screws 26 through complementary openings in the lower flange 33 of the base 30, as illustrated in FIG. 4. Formed in the upper surface of the base 30 eccentrically with respect thereto is a cylindrical bore 34, which extends about halfway into the depth of the base 30 and is provided centrally of its lower end with a smaller-diameter bore 35. Also formed in the upper surface of the base 30 is a small-diameter bore 36, which is spaced from the bore 34 and extends into the base 30 to about the same depth as the bore 35. Slots or passages 37 and 38 (FIGS. 3 and 4) provide communication between the recess 31 and the bores 36 and 35 respectively.

The terminal housing 23 also includes an elongated, electrically insulating socket tube 40 dimensioned to have one end thereof seated snugly in the cylindrical bore 34 of the base 30. The socket tube 40 may be fixed in the base 30 by a suitable radially extending set screw or roll pin 39 (FIG. 3). Disposed within the socket tube 40 at the lower end thereof is a contact terminal assembly 41 which includes a cylindrical contact body 42 retained in the socket tube 40 as by a set screw and formed of a suitable electrically conducting material, such as brass. The contact body 42 has a cylindrical recess 43 formed axially in the upper surface thereof, in which is seated a helical compression spring 44 which, in its rest condition, projects upwardly a predetermined distance above the upper surface of the contact body 42. A generally cup-shaped cap 45 of electrically insulating material is fitted over the upper end of the spring 44 and extends telescopically into the recess 43 a predetermined distance for axially sliding movement relative thereto. Overlying the cap 45 and fixed thereto by suitable means is an electrically conducting contact cap 46, formed of a suitable metal such as brass, and having a diameter slightly less than the inner diameter of the socket tube 40 so as to be freely axially movable therein. The parts are so dimensioned that when the spring 44 is in its normal rest condition, the contact cap 46 is spaced axially a predetermined distance from the contact body 42, as can be seen in FIG. 3. The contact cap 46 has an annular portion surrounding the insulating cap 45 and disposed for axial movement into electrical contact with the contact body 42 against the urging of the bias spring 44. A boss or shoulder on the inner surface of the socket tube 40 may limit upward movement of the contact cap 46.

Fixed by suitable means in the bore 36 of the base 30 is one end of an elongated, insulated, electrical cord or cable 47, which is provided at the other end thereof with a contact terminal 48 in the form of an alligator clip, surrounded with a suitable electrically insulating hood 49.

Figure 5:
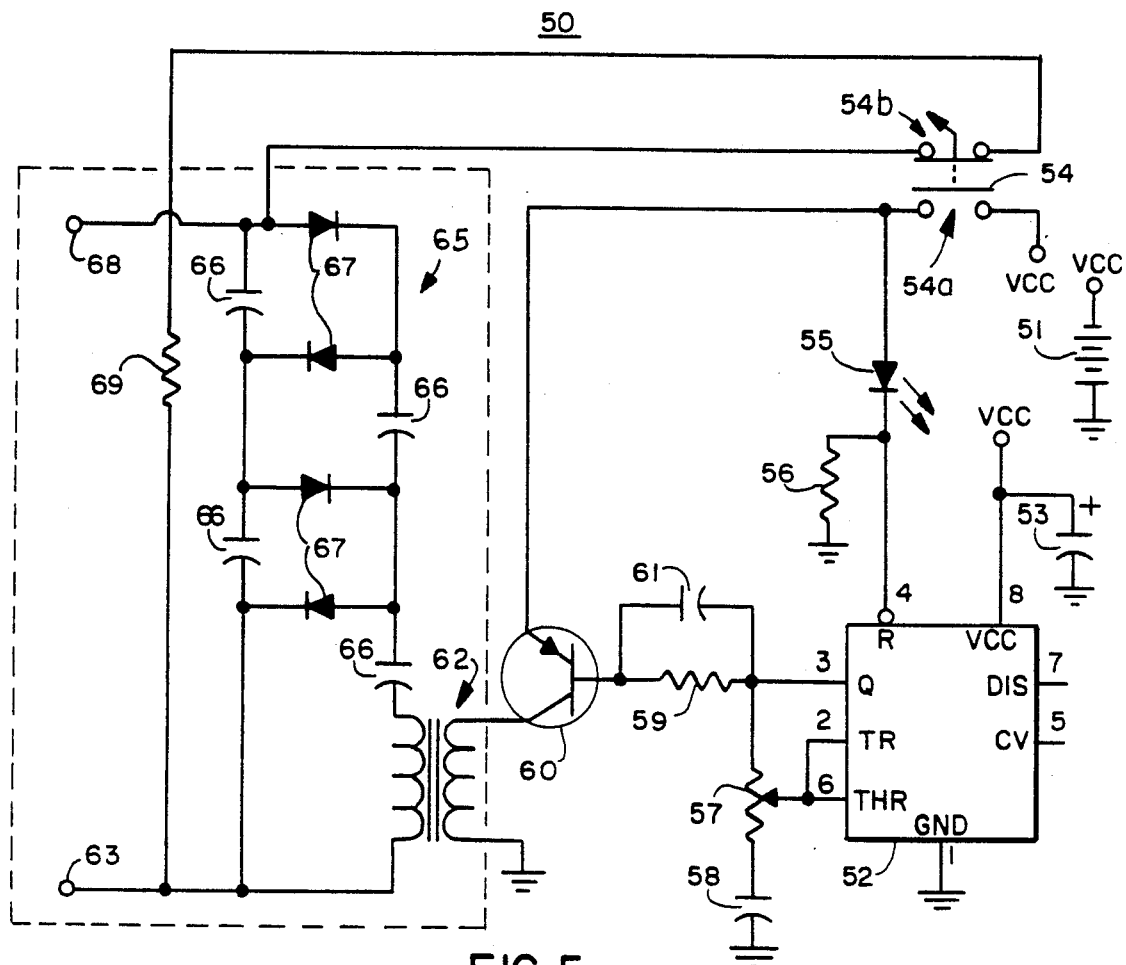
FIG. 5 is a schematic circuit diagram of the voltage generating circuit of the tester of FIG. 1.

Referring now also to FIG. 5, the tester 20 includes an voltage generating circuit 50 which is disposed in the circuit housing 22, as on a suitable circuit board 50a (FIG. 3). The circuit 50 is powered by a suitable battery 51, such as an 9-volt alkaline battery, which produces an output voltage VCC. Connected across the battery 51 is an integrated circuit (IC) pulse generator 52, which may be an LM555, and which produces a square wave output voltage. A bypass capacitor 53 is connected across the power supply input pins 1 and 8 of the IC 52. The battery 51 is also connected through one pole 54a of a double-pole, double-throw switch 54 and an LED 55 to the reset pin 4 of the IC 52, the LED 55 providing a current path for the reset pin and providing an indication that the circuit 50 is energized. It will be appreciated that the switch 54 is actuated by the pushbutton 27 on the circuit housing 22, and the LED 55 is disposed immediately beneath the lens 28 on the circuit housing 22. A resistor 56 is connected between the reset pin of the IC 52 and ground to provide current limiting for LED 55.

Timing control for the IC 52 is provided by an RC timing circuit, including a potentiometer 57 and a capacitor 58, connected in series between the output pin 3 of the IC 52 and ground, the wiper of the potentiometer 57 being connected to the timing pins 2 and 6 of the IC 52. It will be appreciated that the potentiometer 57 may be adjusted to control the frequency and duty cycle of the output pulses from the IC 52, which is operated in the astable mode.

The output of the IC 52 is applied through a resistor 59 to the base of a power transistor 60, a capacitor 61 being connected in parallel with the resistor 59 for cooperation therewith to differentiate the output pulses from the IC 52. The emitter of the transistor 60 is connected to the anode of the LED 55, while the collector of the transistor 60 is connected to ground through the primary winding of a transformer 62, which is configured as a step-up transformer, preferably having a 1:10 ratio. The secondary winding of the transformer 62 has one terminal thereof connected to an output terminal 63 and the other terminal thereof connected through a voltage multiplying network 65 to an output terminal 68. The multiplying network 65 includes a series of cascaded voltage doublers, including capacitors 66 and diodes 67 in a known configuration, so that the output voltage across the terminals 63 and 68 is a rectified predetermined multiple of the voltage across the secondary winding of the transformer 62. A resistor 69 is connected through the other pole 54b of the switch 54 across the output terminals 63 and 68. The resistor 69 preferably has a very high resistance, such as 18 megohms, and serves to rapidly discharge the voltage doubling network 65 when the circuit 50 is de-energized and also serves to protect the switch 54 from excessive voltage across it, which might result in arcing. The output terminals 63 and 68 are, respectively, connected to the contact terminal 48 and the contact terminal assembly 41 by suitable conductors 63a and 68a (FIGS. 3 and 4) which, respectively, extend through the passages 37 and 38.

In operation of the circuit 50, when the switch 54 is depressed, the pole 54a thereof is closed, connecting the battery 51 to the IC 52 and the power transistor 60 and disconnecting the shorting resistor 69. The IC 52 then produces an output pulse train which is preferably in the range of a few Hz to several hundred Hz., dependent upon the values of the circuit elements and the adjustment of the potentiometer 57. In the preferred embodiment of the invention, it has been found that an output pulse frequency of about 200 Hz. provides optimum results. The square wave pulses are differentiated to provide a series of spikes which are fed through the power transistor 60 to the transformer 62. In a constructional model of the invention, the output of the power transistor is about 20 volts and is stepped up to about 200 volts by the transformer 62 and is, in turn, rectified and multiplied by the multiplying network 65 to approximately 2000 VDC at the output terminals 63 and 68. It will be appreciated that the voltage at the output of the power transistor 60 and, thus, the voltage at the output terminals 63 and 68 can be adjusted by adjusting the potentiometer 57. The output voltage will continue as long as the switch 54 is held depressed, a typical voltmeter test requiring only a few seconds. When the switch 54 is released, its pole 54a is opened, deenergizing the voltage generator circuit 50 and the pole 54b is closed, reconnecting the shorting resistor 69 across the output terminals 63 and 68.

Referring to FIG. 2, in a typical application of the tester 20 the contact terminal 48 is clipped to the probe 19 of the voltmeter 10, while the end of the pole 11 carrying the probe 13 is inserted in the socket tube 40, pushing the probe 13 into electrical contact with the contact cap 46 and, in turn, pushing the contact cap 46 into electrical contact with the contact body 42 against the urging of the bias spring 44. While the operator thus holds the contact terminal assembly 41 closed with one hand, he actuates the pushbutton 27 with the other hand to energize the voltage generating circuit 50. The LED 55 will be illuminated to confirm that the circuit is energized. The tester 20 will thus apply a high voltage, in the range of 1-2 kilovolts depending on adjustment of the circuit, across the probes 13 and 19 of the voltmeter 10. If the voltmeter 10 is operating properly, the meter 14 should register approximately the output voltage of the tester 20, within an acceptable calibration error range. If not, this is an indication that the voltmeter is malfunctioning.

Figure 6:
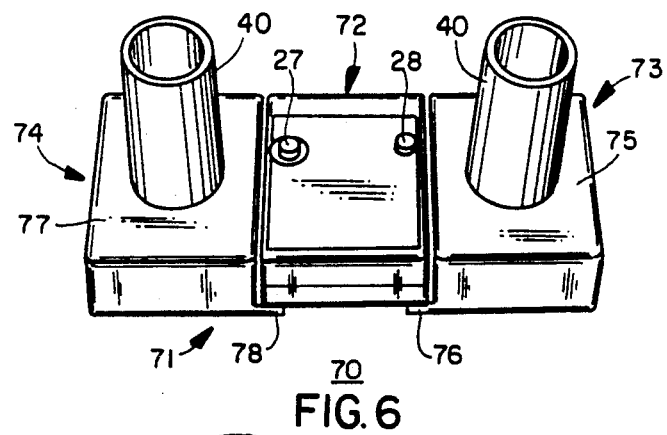
FIG. 6 is a perspective view of an alternative form of the tester of the present invention.

Referring now also to FIG. 6, there is illustrated an alternative form of tester, generally designated by the numeral 70, which has a housing assembly 71. The housing assembly 71 includes a circuit housing 72, which is substantially identical to the circuit housing 22 described above, except that the terminal conductors 63a and 68a are passed, respectively, out of the opposite sides of the housing 72 rather than out of one end thereof. The housing assembly 71 also includes two terminal housings 73 and 74 arranged substantially as mirror images of each other, and respectively disposed on opposite sides of the circuit housing 72. More specifically, the terminal housing 73 has a rectangular base 75 with a lateral flange 76 and the housing 74 has a rectangular base 77 with a lateral flange 78, the flanges 76 and 78 being respectively disposed beneath the opposite side edges of the circuit housing 72 and secured thereto by the assembly screws of the housing 72. The housing bases 75 and 77 respectively carry two socket tubes 40 which are mounted in the same manner as was described above in connection with the tester 20. One of the socket tubes 40 is provided at its lower end with the contact terminal assembly 41 in the same manner as was described above in connection with FIG. 3. The other socket tube 40 is preferably provided with a fixed electrically conductive contact terminal (not shown). The terminals in the socket tubes 40 are respectively connected to the output terminals of the circuit 50 by suitable conductors extending through suitable passages in the bases 75 and 77.

In operation, one of the voltmeter poles is inserted in the socket tube 40 having a fixed contact terminal and is allowed to rest in electrical contact therewith by gravity, while the other pole is inserted in other socket tube 40 and is pushed downwardly thereinto to close the contact terminal assembly 41, in the same manner as was described above in connection with the tester 20. The user then actuates the pushbutton 27 to perform the test. It will be appreciated that, in the case of a hook-shaped probe 19, the probe may not fit into the socket tube 40 and may have to be unscrewed from the probe mount 18 (see FIG. 7) to permit insertion of the associated pole 17 into the socket tube 40. This will work as long as the probe mount 18 is electrically conductive.

If desired, spring-loaded contact terminal assemblies 41 could be disposed in each of the socket tubes 40 of the tester 70. In this event, since both of the user's hands would be needed to push the poles 11 and 17 into the socket tubes 40, the user would not have a hand free to actuate the pushbutton 27. Thus, the switch 54 could be actuated by a suitable actuator disposed in either one of the socket tubes 40. If desired, this arrangement could also be used in the tester 20, in which case the pushbutton 27 could be dispensed with.

Preferably, the socket tubes 40 have a length such that the portion thereof extending upwardly above the contact terminal assembly 41 is longer than the length of a normal human finger, so as prevent a user being exposed to the output voltage of the tester. Even if a user's finger could reach the contact cap 46, it would not be live unless the user pressed it down against the urging of spring 44 into contact with the contact body 41. It is a significant aspect of the invention that the tester 20 or 70 is compact, lightweight (weighing only two to three pounds) and completely portable, its battery power making it uniquely adaptable for field use.

From the foregoing, it can be seen that there has been provided a unique tester for a high-voltage voltmeter which is portable, of compact and economical construction, produces a high test voltage in the kilovolt range, and which provides safety features for protecting a user from accidental exposure to the output voltage.

We claim:

1. A portable tester for a high-voltage measuring apparatus which includes two electrically conductive probes for electrical coupling respectively to points in a high-voltage circuit between which the potential is to be measured, with at least one of the probes being disposed at a probe end of an elongated electrically insulating pole, and a voltmeter connected across the probes, said tester comprising: housing means including an elongated tubular socket formed of electrically insulating material and having an open outer end and a closed inner end and dimensioned to receive the probe end of the pole, generating means disposed in said housing means and having a pair of output terminals and generating a high-voltage test signal across said output terminals, and two contact terminals respectively connected to said output terminals and respectively disposed for electrical connection to the probes, one of said contact terminals being disposed at the inner end of said tubular socket for electrical contact with the probe end of the pole when it is inserted in the socket.

2. The tester of claim 1, and further comprising activating means for selectively energizing said generating means.

3. The tester of claim 2, wherein said generating means is battery-powered.

4. The tester of claim 1, wherein the other of said contact terminals includes a clip for conductive engagement with the other of the probes.

5. The tester of claim wherein said one contact terminal includes a first conductive member connected to the corresponding one of the output terminals and a second conductive member normally spaced from said first conductive member and engageable with the probe end of the pole, and means mounting said second conductive member for movement into electrical contact with said first conductive member in response to insertion of the probe end of the pole in said socket for establishing electrical connection between the probe and said generating means.

6. The tester of claim 5, and further comprising means resiliently biasing said second conductive member to a normal rest position spaced from said first conductive member.

7. The tester of claim wherein said socket has a length such that a human finger inserted in the socket cannot reach said one of said contact terminals.

8. The tester of claim 1, wherein said housing means includes a first housing portion enclosing said generating means and a second housing portion carrying said tubular socket and detachably connected to said first housing portion.

9. The tester of claim 8, and further comprising elongated cable means connected to the other of said contact terminals, said second housing portion including two cavities therein for respectively receiving said cable means and said tubular socket, a recess formed in said second housing means for receiving a portion of said first housing means, passage means providing communication between said recess and said cavities, and conductor means extending through said passage means and connecting said output terminals respectively to said cable means and said one contact terminal.

10. The tester of claim 8, and further comprising activating means including switch means on said first housing portion for selectively energizing said generating means.

11. A portable tester for a high-voltage measuring apparatus which includes two elongated electrically insulating poles each having an electrically conductive probe end, the probe ends being adapted for electrical coupling respectively to points in a high-voltage circuit between which the potential is to be measured, and a voltmeter connected across the probes, said tester comprising: housing means including two elongated tubular sockets formed of electrically insulating material and each having an open outer end and a closed inner end, said sockets being respectively dimensioned to receive the probe ends of the poles, generating means disposed in said housing means and having a pair of output terminals and generating a high-voltage test signal across said output terminals, two contact terminals respectively disposed at the inner ends of said tubular sockets and adapted to be electrically connected to the probe ends when they are disposed in said sockets, and means connecting said contact terminals respectively to said output terminals.

12. The tester of claim and further comprising activating means for selectively energizing said generating means.

13. The tester of claim 12, wherein said generating means is battery-powered.

14. The tester of claim 11, wherein one of said contact terminals includes a first conductive member connected to the corresponding one of the output terminals and a second conductive member normally spaced from said first conductive member and engageable with the probe end of the pole, and means mounting said second conductive member for movement into electrical contact with said first conductive member in response to insertion of the probe end of a pole in said socket for establishing electrical connection between the probe and said generating means.

15. The tester of claim 14, and further comprising means resiliently biasing said second conductive member to a normal rest position spaced from said first conductive member.

16. The tester of claim 11, wherein each of said sockets has a length such that a human finger inserted in the socket cannot reach the associated contact terminal.

17. The tester of claim 11, wherein said housing means includes a first housing portion enclosing said generating means and separable from said sockets.

18. The tester of claim 17, wherein said housing means includes second and third housing portions respectively removably connected to said first housing portion and respectively carrying said sockets.

19. The tester of claim 18, wherein each of said second and third housing portions includes a cavity for receiving the associated one of said sockets, attachment means for releasable attachment to said first housing portion, and passage means communicating with said cavity, and further comprising conductor means extending through said passage means and electrically connecting said output terminals respectively with said contact terminals.

* * * * *

UNITED STATES PATENT AND TRADEMARK OFFICE
CERTIFICATE OF CORRECTION

PATENT NO. : 5,291,124
DATED : March 1, 1994
INVENTOR(S) : Mark R. Hoffman and Niels C. Pedersen, Jr.

It is certified that error appears in the above-indentified patent and that said Letters Patent is hereby corrected as shown below:

Column 7, line 36, insert --1-- after "claim";

line 51, insert --1-- after "claim"; and

Column 8, line 28, insert --11-- after "claim".

Signed and Sealed this

Sixteenth Day of August, 1994

Attest:

BRUCE LEHMAN

*Attesting Officer*      *Commissioner of Patents and Trademarks*